US011133390B2

(12) United States Patent
Ranade et al.

(10) Patent No.: US 11,133,390 B2
(45) Date of Patent: Sep. 28, 2021

(54) LOW TEMPERATURE, THIN FILM CRYSTALLIZATION METHOD AND PRODUCTS PREPARED THEREFROM

(71) Applicant: THE BOEING COMPANY, Chicago, IL (US)

(72) Inventors: Alpana N. Ranade, Bellevue, WA (US); Marvi A. Matos, Seattle, WA (US); Gregory M. Newbloom, Seattle, WA (US)

(73) Assignee: The Boeing Company, Chicago, IL (US)

( * ) Notice: Subject to any disclaimer, the term of this patent is extended or adjusted under 35 U.S.C. 154(b) by 0 days.

(21) Appl. No.: 13/836,646

(22) Filed: Mar. 15, 2013

(65) Prior Publication Data

US 2014/0264319 A1 Sep. 18, 2014

(51) Int. Cl.
*H01L 29/24* (2006.01)
*C30B 1/02* (2006.01)
*H01B 1/00* (2006.01)

(52) U.S. Cl.
CPC ............ *H01L 29/247* (2013.01); *C30B 1/023* (2013.01); *H01B 1/00* (2013.01)

(58) Field of Classification Search
CPC ..... H01B 1/00; H01L 29/247; H01L 41/0805; H01L 41/1132; H01L 41/314; H01L 1/16; C08F 290/145; C08F 299/024; C08G 18/603; C08G 18/6423; C08G 18/8116; C08L 75/16; C08J 9/283; H05K 1/0218; C30B 1/023; A61K 9/5115; A61K 31/4188; A61K 9/5192; A61K 49/0093;

(Continued)

(56) References Cited

U.S. PATENT DOCUMENTS

| 4,250,074 A * | 2/1981 | Foscante ............ C08G 59/4085 523/428 |
| 4,373,768 A * | 2/1983 | Clarke ..................... G01K 3/00 356/44 |
| 5,404,835 A | 4/1995 | Yoder |

(Continued)

FOREIGN PATENT DOCUMENTS

| CN | 101331590 A | 12/2008 |
| CN | 102143995 A | 8/2011 |

(Continued)

OTHER PUBLICATIONS

Jolivet, J.-P.; Cassaignon, S.; Chaneac, C.; Chiche, D.; Durupthy, O.; Portehault, D. (2010). Design of metal oxide nanoparticles: Control of size, shape, crystalline structure and functionalization by aqueous chemistry, Comptes Rendu Chimie, 13, pp. 40-51.

(Continued)

*Primary Examiner* — Mouloucoulaye Inoussa
(74) *Attorney, Agent, or Firm* — MH2 Technology Law Group LLP

(57) ABSTRACT

An organic material with a porous interpenetrating network and an amount of inorganic material at least partially distributed within the porosity of the organic material is disclosed. A method of producing the organic-inorganic thin films and devices therefrom comprises seeding with nanoparticles and depositing an amorphous material on the nanoparticles.

23 Claims, 1 Drawing Sheet

(58) Field of Classification Search
CPC .............. F01N 13/14; F01N 13/102; Y10T 428/249987; Y10T 428/31678; Y10T 428/265
USPC ........... 257/43; 438/104, 105, 485; 521/142; 428/195.1, 315.7, 411.1
See application file for complete search history.

(56) References Cited

U.S. PATENT DOCUMENTS

| | | | |
|---|---|---|---|
| 6,239,355 B1* | 5/2001 | Salafsky | H01L 25/043 136/249 |
| 7,951,422 B2 | 5/2011 | Pan et al. | |
| 8,097,657 B2 | 1/2012 | Kato et al. | |
| 8,202,365 B2 | 6/2012 | Umeda et al. | |
| 2001/0048498 A1* | 12/2001 | Tomioka | G02F 1/133723 349/123 |
| 2002/0015881 A1* | 2/2002 | Nakamura | H01M 14/005 429/111 |
| 2002/0168812 A1* | 11/2002 | Oda | H01L 21/76802 438/200 |
| 2003/0047816 A1* | 3/2003 | Dutta | B82Y 30/00 257/788 |
| 2003/0175004 A1* | 9/2003 | Garito | G02B 6/122 385/143 |
| 2005/0236556 A1* | 10/2005 | Sargent | B82Y 10/00 250/214.1 |
| 2006/0062902 A1 | 3/2006 | Sager et al. | |
| 2006/0280945 A1 | 12/2006 | Pribat | |
| 2008/0234395 A1* | 9/2008 | Miyasaka | C01G 9/02 516/33 |
| 2008/0276987 A1 | 11/2008 | Flood | |
| 2009/0152506 A1* | 6/2009 | Umeda | H01L 21/02628 252/500 |
| 2009/0233374 A1* | 9/2009 | Zang | G01N 21/6428 436/106 |
| 2011/0081527 A1* | 4/2011 | Yamato | H05K 3/386 428/195.1 |
| 2011/0207842 A1* | 8/2011 | Kato et al. | 521/142 |
| 2011/0284861 A1 | 11/2011 | Kim et al. | |
| 2012/0202045 A1* | 8/2012 | Mutsuda | F01N 13/14 428/318.4 |
| 2013/0000952 A1 | 1/2013 | Srinivas et al. | |
| 2013/0269782 A1* | 10/2013 | Matos | H01L 31/0384 136/263 |
| 2016/0333145 A1* | 11/2016 | De Cola | C08L 101/16 |

FOREIGN PATENT DOCUMENTS

| | | |
|---|---|---|
| JP | H05-009099 A | 1/1993 |
| JP | H07-273339 A | 10/1995 |
| JP | H08-273339 A | 10/1996 |
| JP | 2009-167087 A | 7/2009 |

OTHER PUBLICATIONS

Shrotriya, V.; Li, G.; Yao, Y.; Chu, C.-W.; Yang, Y. (2006). Transition metal oxides as the buffer layer for polymer photovoltaic cells, Applied Physics Letters, 88, pp. 073508-073508-3.
Barankin, M. D.; Gonzalez II, E.; Ladwig, A. M.; Hicks, R. F. (2007). Plasma-enhanced chemical vapor deposition of zinc oxide at atmospheric pressure and low temperature. Solar Energy Materials and Solar Cells, 91, pp. 924-930.
Chang, K.-M.; Huang, S.-H.; Wu, C.-J.; Lin, W.-L.; Chen, W.-C.; Chi, C.-W.; Lin, J.-W.; Chang, C.-C. (2011). Transparent conductive indium-doped zinc oxide films prepared by atmospheric pressure plasma jet. Thin Solid Films, 519, pp. 5114-5117.
Kobayashi, N. P.; Kobayashi, J. T.; Zhang, X.; Dapkus, P. D.; Rich, D. H. (1999). Epitaxial lateral overgrowth of GaN over AlOx surface formed on Si substrate. Applied Physics Letters, 74, pp. 2836-2838.
Kuwahara, K.; Itagaki, N.; Nakaharam, K.; Yamashita, D.; Uchida, G.; Kamataki, K.; Koga, K.; Shirantani, M. (2012). High quality epitaxial ZnO films grown on solid-phase crystallized buffer layers. Thin Solid Films. 520, pp. 4674-4677.
Escribano, J. A.; Gonzalo-Juan, I.; Sanchez-Herencia, A. J.; Ferrari, B. (2012) AFM characterization of the nanoparticles arrangement by electrophoretic deposition. Key Engineering Materials, Issue: Electrophoretic Deposition: Fundamentals and Applications IV, 507, pp. 61-66.
Yang, Shikuan; Xu, Jingjing; Wang, Zhenyang; Zeng, Haibo; Lei, Yong,(2011) Janus particle arrays with multiple structural controlling abilities synthesized by seed-directed deposition. Journal of Materials Chemistry, 21(32), pp. 11930-11935.
Chung, Yi-Wen; Fang, Huang-Sheng; Lee, Jian-Hong; Tsai, Chih-Jen (2010) Fabrication of flexible thin film with pattern structure and macroporous array consisting of nanoparticles by electrophoretic deposition Japanese Journal of Applied Physics, 49 (6, Pt. 2). pp. 06GH11/1-06GH11/4.
Li, Jianjun; Zhang, Xingtang; Chen, Yanhui; Li, Yuncai; Huang, Yabin; Du, Zuliang; Li, Tiejin(2005) Synthesis of highly ordered SnO2/Fe2O3 composite nanowire arrays by electrophoretic deposition method, Chinese Science Bulletin, 50 (10), pp. 1044-1047.
T.L. Sounart, J. Liu, J. A. Voigt, J.W.P. Hsu, E.D. Spoerke, Z. Tian, and Y. Jiang(2006) Sequential Nucleation and Growth of Complex Nanostructured Films, Advanced Functional Materials, 16, pp. 335-344.
European Patent Office; Extended European Search Report for European Patent Application No. 14159956.3 dated Mar. 16, 2017, 7 pages.
Chinese Patent Office; Office Action for Chinese Patent Application No. 201410094184.2 dated Jun. 27, 2017, 15 Pages.
Chinese Patent Office; Office Action for Chinese Patent Application No. 201410094184.2 dated Oct. 30, 2017, 6 Pages.
Chinese Patent Office; Office Action for Chinese Patent Application No. 201410094184.2 dated Apr. 20, 2018, 13 Pages.
Japanese Patent Office; Office Action for Japanese Patent Application No. 2014-047798 dated Jan. 23, 2018, 10 Pages.
Examination Report dated Mar. 13, 2019 in corresponding European Application No. 14159956.3, 7 pages.
Moon et al., "Oriented Lead Titanate Film Growth at Lower Temperatures byt he Sol-Gel Method on Particle-Seeded Substrates," Journal of the American Ceramic Society, vol. 80, No. 10, Oct. 1, 1997, pp. 2613-2623.
Tian et al., "Complex and Oriented ZNO Nanostructures," Nature Materials, vol. 2, No. 12, Dec. 1, 2003, pp. 821-826.
Yu et al., "Control and Characterization of Individual Grains and Grain Boundaries in Graphene Growth by Chemical Vapour Deposition," Nature Materials, vol. 10, No. 6, Jun. 1, 2011, pp. 443-449.
Notice of Reasons for Rejection dated Aug. 13, 2019 in corresponding Japanese Application No. 2018-142351, 6 pages.
Notice of Reasons for Rejection dated Mar. 31, 2020 in corresponding Japanese Application No. 2018-142351, 6 pages.
Communication pursuant to Article 94(3) EPC issued in corresponding European Application No. 14 159 956.3 dated May 18, 2020, 4 pages.
Notice of Office Action dated Jun. 1, 2020 in corresponding Korean Application No. 10-2014-0012397, 9 pages.
Notice of Reasons for Rejection dated Nov. 4, 2020 in corresponding Japanese Patent Application No. 2018-142351, includes English translation, 4 pages.
Notice of Final Rejection dated Dec. 2, 2020 in corresponding Korean Patent Application No. 10-2014-0012397, includes English translation, 6 pages.
Notification of First Office Action dated Mar. 29, 2021 in corresponding Chinese Application No. 2020100922033, together with English translation.

* cited by examiner

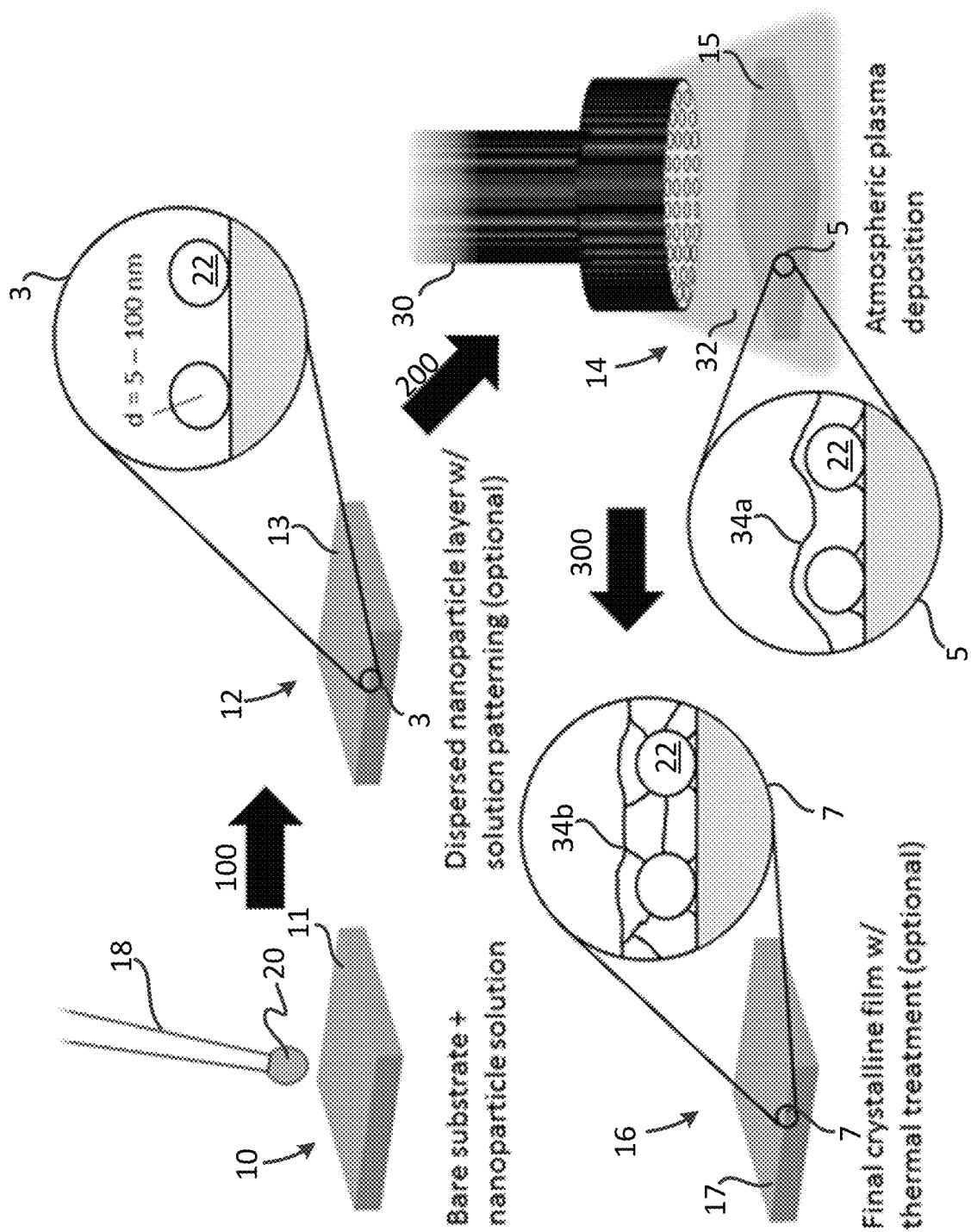

LOW TEMPERATURE, THIN FILM CRYSTALLIZATION METHOD AND PRODUCTS PREPARED THEREFROM

TECHNICAL FIELD

This disclosure relates to at least partially crystalline thin films and methods for forming same. Specifically, the method comprises introducing a plurality of crystalline nanoparticles to a substrate; depositing a thin film of amorphous material on at least a portion of the plurality of crystalline nanoparticles and inducing crystallization of at least a portion of the thin film amorphous material, and films and devices therefrom.

BACKGROUND

Crystallization of certain metal oxides useful in energy harvesting devices (i.e., zinc oxide, indium tin oxide (ITO)) has substantial energetic barriers, typically requiring high temperatures (425-1200 degrees C.) to initiate. As a result, it is difficult if not impossible to directly coat low-temp substrates (e.g., electronic devices, polymeric films, etc.) with amorphous films that can be subsequently crystallized. Low temperature deposition processes generally result in disordered (amorphous) structures limiting their properties and effectiveness in advanced devices where an otherwise crystalline structure is required or desired.

SUMMARY

In a first embodiment, a method for making at least partially crystalline thin film is provided. The method comprising: introducing a plurality of crystalline nanoparticles to a substrate; depositing a thin film of amorphous material on at least a portion of the plurality of crystalline nanoparticles; and inducing crystallization of at least a portion of the thin film amorphous material.

In one aspect of the embodiment the substrate is a conductive polymer.

Alone or in combination with the previous aspects, inducing crystallization provides lateral epitaxial growth of the amorphous material. The inducing crystallization can be heterogeneous nucleation of the amorphous material.

Alone or in combination with the previous aspects, one or more of the plurality of crystalline nanoparticles is a Janus particle.

Alone or in combination with the previous aspects, the thin film of amorphous material comprises one or more metal oxides, metal nitrides, boron nitride, silicon nitride, or diamond. The thin film of amorphous material can comprise one or more semiconductive materials.

Alone or in combination with the previous aspects, the deposition step comprises a plasma enhanced deposition technique. The deposition step can comprise a physical vapor deposition technique and/or an atmospheric plasma deposition technique.

Alone or in combination with the previous aspects, the inducing crystallization comprises applying heat less than an amount capable of causing a chemical or structural change of the substrate.

Alone or in combination with the previous aspects, the introducing of the plurality of crystalline nanoparticles provides on at least a portion of the substrate an ordered arrangement of at least a portion of the plurality of crystalline nanoparticles. The ordered arrangement of at least a portion of the plurality of crystalline nanoparticles can provide a seeding form at the interface between the plurality of crystalline nanoparticles and the substrate.

In another embodiment, an organic material is provided, comprising a porous interpenetrating network, and inorganic material present in at least a portion of the porous interpenetrating network, the inorganic material being at least partially crystalline.

In one aspect, alone or in combination with the previous aspects, the organic material further comprises a plurality of crystalline nanoparticles, where the plurality of crystalline nanoparticles present can be arranged in a pattern. In one aspect, alone or in combination with the previous aspects, the inorganic material comprises (i) a quantity of crystalline material the same as, and in addition to, the plurality of crystalline nanoparticles; or (ii) a quantity of crystalline material different than that of the plurality of crystalline nanoparticles. In one aspect, alone or in combination with the previous aspects, the organic material is a flexible polymeric film.

In one aspect, alone or in combination with the previous aspects, the organic material is deposited on a substrate comprising an electrically conductive film of metal, indium tin oxide, or is a transparent conductive film. The substrate can be a conjugated polymeric film.

In one aspect, alone or in combination with the previous aspects, the plurality of crystalline nanoparticles are semiconductive.

In another embodiment, an organic material made by the method of: depositing a thin film of amorphous material on at least a portion of a plurality of crystalline nanoparticles arranged on a substrate; and inducing crystallization of at least a portion of the thin film amorphous material.

In an aspect, alone or in combination with the previous aspects, the substrate is a flexible polymer film. The substrate is a conductive conjugated polymer film.

Alone or in combination with the previous aspects, the amorphous material is a semiconducting metal oxide. The inducing can be by hetero- or homogenous epitaxial growth.

Alone or in combination with the previous aspects, the plurality of crystalline nanoparticles comprise semiconducting metal oxide.

BRIEF DESCRIPTION OF THE DRAWING

The FIGURE depicts an exemplary embodiment of the present method disclosed herein.

DETAILED DESCRIPTION

The present disclosure provides a method of forming crystalline domains, with tunable grain size, at low temperatures on thin film substrates. The method is applicable for the manufacture of thin film transistors and other electronic devices, including, but not limited to light emitting diodes, photovoltaics or resistive touch displays or sensors.

Definitions

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element such as a layer, region or substrate is referred to as being "deposited on" or "deposited onto" another element, it can be directly deposited on or deposited onto the other element or intervening elements may also be present. In contrast, when an element is referred to as being "directly deposited on" or "directly deposited onto" another element, there are no intervening elements present.

Relative terms such as "below" or "above" or "upper" or "lower" or "horizontal" or "vertical" or "top" or "bottom" may be used herein to describe a relationship of one element, layer or region to another element, layer or region as illustrated in the figures. It will be understood that these terms are intended to encompass different orientations of the device in addition to the orientation depicted in the figures.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, steps, operations, elements, and/or components, but do not preclude the presence or addition of one or more other features, steps, operations, elements, components, and/or combinations thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Unless otherwise expressly stated, comparative, quantitative terms such as "less" and "greater", are intended to encompass the concept of equality. As an example, "less" can mean not only "less" in the strictest mathematical sense, but also, "less than or equal to."

The term "organogel" is inclusive of solid or semi-solid material, partially or substantially crystalline and/or amorphous material having an organic phase comprising a three-dimensionally network inclusive of self-assembled mono- or multilayers of structured molecules or polymers. The three-dimensional network of the organogel can be cross-linked. Cross-linking can be physical or chemical.

The phrase "seeding form factor" as used herein is inclusive of a nanoparticle with a suitable three-dimensional shape capable of acting as a seed for crystallization. Form factors include, but are not limited to: spheres, rods, ellipsoids, cubes, sheets, etc. An example of a seeding form factor would be a crystalline, spherical ZnO nanoparticles.

The term "nanoparticle" is used herein to relate to particles with an average dimension (diameter or longest longitudinal axis) between 0.1 nanometer (nm) and 100 nm.

The term "amorphous" as used herein is inclusive of less than 10% total crystallinity of a unit volume of material, and includes essentially no detectable crystallinity as determinable by conventional methods.

The term "substantially" as used herein is inclusive of an amount greater than 80%, greater than 85%, greater than 90%, greater than 95%, up to 100%. For example, substantially crystalline is inclusive of an amount of crystallinity between 80% and 100%.

The term "about" as used herein is inclusive of, independently, +/−10%, of the stated value unless otherwise indicated.

The present method provides for the formation of one or more crystalline domains within or on a thin film. In one embodiment the method comprises the following steps: (1) optionally, nanoparticle synthesis and nucleation, (2) solution processing and ordering and (3) deposition and optionally (4) mild thermal treatment during or post-deposition. In one aspect, the solution phase is composed of suspended crystalline nanoparticles formed through colloidal reaction, nucleation and growth from nanoparticle precursors.

Controlling precursor concentrations and growth conditions provides numerous material compositions with tunable grain boundaries, shapes, and sizes. Single component or multicomponent particles, including Janus particles, can be generated through synthesis and nucleation in accordance with the methods herein disclosed. Nanoparticles can be functionalized in solution before deposition with single or multiple chemical moieties. After synthesis, the nanoparticle solution is processed from bulk fluid via the use of solution-processing methods such as spray coating, spin coating, dip coating, evaporation, screen printing, blade printing or any other suitable approach to coat a substrate with a fluid material.

An optional step comprising the arrangement of the nanoparticles, for example, functionalized nanoparticles, through the use of techniques such as but not limited to: electrokinetic, electromagnetic, magnetic or evaporation mediated deposition, can be employed for surface patterning. Surface patterning includes nanoparticle arrays which can be highly ordered or of lower order. Other self-assembly techniques can be used to organize the nanoparticles in patterned arrays. The self-assembly techniques can be mediated by: (1) the single or multi-chemical composition or functionalization of the nanoparticles, (2) providing particle charge, (3) providing surface potential, (4) providing zeta potential, (5) providing polarity, (6) controlling solution pH and/or ionic conditions, (7) controlling particle size (8) controlling particle shape (i.e. ellipsoidal, spherical, cylindrical), among other process parameters to provide dispersed or uniformly arranged crystalline nanoparticles that retain their conductive, optical and structural properties, on a substrate with a packing density less than or equal to a single monolayer. These crystalline nanoparticles can act as a seed layer for the lateral epitaxial overgrowth of a crystalline film from a subsequently deposited amorphous inorganic semiconductor material.

Thus, in one embodiment, the present method comprises the deposition of either an identical or non-identical amorphous material to that of the crystalline nanoparticles. Thus, for example, nanoparticles of metal oxide presented to the surface and optionally patterned thereon, can subsequently be covered by a deposited metal oxide (e.g. a-ZnO on c-ZnO or a-$TiO_2$ on c-ZnO) through a deposition technique. In one aspect, the deposition creates a conformal coating of amorphous metal oxide phase on the substrate surrounding the crystalline nanoparticles. In one aspect the high kinetic energy of the plasma, in combination with the energy from a mild thermal treatment, exceeds the energetic barrier for crystal formation and allows for the lateral epitaxial overgrowth from the seeding crystalline nanoparticles.

Alternatively, one can use low temperature physical vapor deposition techniques, such as magnetron sputtering, to deposit the conformal oxide material. In this case, the final quality of film, the crystal domain sizes and the resulting structural properties can potentially be enhanced using post crystallization techniques such as a mild thermal treatment (e.g., below the decomposition or thermal transformation point of the substrate, which for most polymers is less than 250° C.) to further control the crystallization of the thin film generated using plasma deposition. This thermal treatment can be applied to the substrate during or after plasma deposition. In certain aspects, one or more mild thermal treatments, e.g., at temperatures below the decomposition of thermal transformation points of a polymeric substrate, are used for the crystallization of certain metal oxides with very high energetic barriers and/or to adjust the final film morphology.

Nanoparticle Solutions

Nanoparticles useful for seeds (or seeding crystallization) are obtainable for example, by using any number of solution-dispersions, etching and/or extraction/separation techniques, to provide a source of nanoparticles that can be dispensed on a surface. The nanoparticles can be chemically modified and/or treated and/or combined with any number of surfactants and/or surface modifiers before dispersing the metal nanoparticles into a suitable solvent medium for introduction to the substrate. Alternatively, the solvent medium comprises a surface modifier and/or wetting agent and the nanoparticles are dispensed directly into the solvent medium.

In alternate embodiments of the present disclosure, the nanoparticles can be chemically treated and/or purified and/or washed any number of times prior to dispersing the nanoparticles into the solvent medium. Once the metal nanoparticles are formulated they can be deposited onto a suitable substrate structure which can include substrate materials such as, but not limited to, silicon, metal, quartz, glass, polymeric substrate materials and combinations thereof. The formulated nanoparticle solution is deposited using any suitable deposition or coating technique, including but not limited to ink-jet printing, slide-bar coating, screen printing, spin coating, extrusion coating, meniscus coating, dip coating, blade coating, and spray coating. The layer of the formulated nanoparticle solution deposited can be patterned or unpatterned.

Organic Materials and Polymer Substrates

Any polymer substrate suitable for forming a film can be used. In other embodiments, a flexible substrate, which can be a polymer, is used as a substrate for receiving a material or layer. In certain aspects, a flexible substrate with a conductive layer constitutes a substrate. Thus, in one aspect, a flexible substrate with a conductive layer is used having deposited thereon an additional layer, such as an organogel. Organogels include but are not limited to conjugated molecules, polymers or small-molecule dyes, formed through controlled self-assembly after deposition using solution-based coating methods. The present method is generally applicable to a flexible substrate with a conductive layer coated with an organogel. Such configurations subsequently processed in accordance with the present methods provide a substrate with tunable band-gaps and optical absorption spectra. In one aspect, conjugated polymers are employed as the organogel. The organic material, polymer, or organogel can be deposited on the substrate using a variety of methods such as screen printing, or spray, blade, or spin coating.

Exemplary conjugated polymers include:

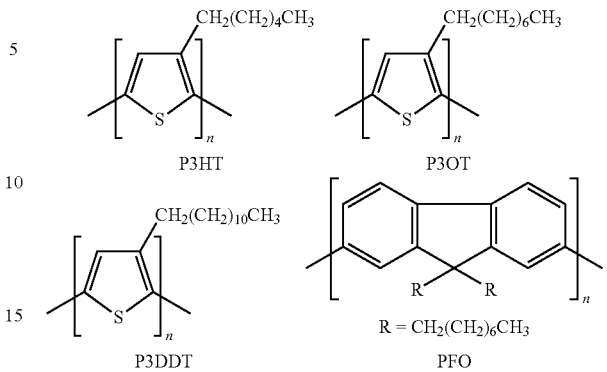

Where P3HT is poly(3-hexylthiophene-2,5-diyl); P3OT is poly(3-octylthiophene-2,5-diyl); P3DDT is poly(3-dodecyl-thiophene-2,5-diyl); and PFO is poly(9,9-dioctyl fluorene. Other conjugated polymers and materials can be used in spirit and scope of the present disclosure. Other materials include acceptors and/or donors capable of adjusting HOMO and LUMO levels of the system, in particular, at organic/inorganic interfaces.

Porous p-Type Thin Film Coatings

In one aspect, the substrate is one or more conjugated polymers prepared such that a porous thin-film structure, which is inclusive of an interpenetrating fiber network, is provided. In one example, the conjugated organic polymer is dissolved in a solvent, cooled rapidly, and allowed to gel. In one aspect, the conjugated organic polymer dissolved in a solvent and cooled rapidly provides an organogel. In one aspect, the organogel comprises an interpenetrating network of conjugated polymer fibers. The interpenetrating network of conjugated polymer fibers can provide a defined fiber structure (organic phase organic domain). In one aspect, the fiber structure is a "pi-pi" stacked fiber structure. The inter-penetrating network of conjugated polymer fibers can comprise covalently or non-covalently coupled fibers. The covalently or non-covalently coupled fibers can be branched, linear, or combinations thereof, covalently or ionically cross-linked or substantially non-cross-linked.

Amorphous and/or Crystalline Inorganic Materials

Exemplary inorganic materials that can be used as the nanoparticle seeds or as the amorphous coating material can include inorganic oxides, inorganic carbides, or inorganic nitrides, for example, oxides/nitrides/carbides of boron, titanium, zinc, iron, tungsten, vanadium, aluminum, niobium, oxides of silver, oxides of copper, oxides of tin, and mixtures and/or polymorphs thereof. In certain aspects, the inorganic materials are semiconductors. The oxides listed above include sub-oxides, stoichiometric oxides, and super-oxides, and includes, without limitation, one or more of $TiO_2$, ZnO, $Fe_2O_3$, $WO_3$, $SnO_2$, $Al_2O_3$, $V_2O_3$, $MoO_3$, NiO, $SrTiO_3$, as well as cesium carbonate $Cs(CO_3)$, aluminum nitride (AlN), and boron nitride (BN). The one or more of inorganic oxide, inorganic carbide, inorganic sulfides, or inorganic nitrides can be used in a form that is suitable for deposition. The one or more of inorganic oxide, inorganic carbide, or inorganic nitrides can be of a size or form suitable for deposition on the substrate, including powders, micron particles, submicron particles, nanoparticles, and physical mixtures and/or distributions thereof. Organometallic precursor compounds can be used alone or in combination with other reactants/ precursors to introduce, in-situ, and/or the formation of the inorganic material. Non-limiting examples of organometallic precursors include metal alkyls, metal hydrides, metal carboxylates, metal cyclopentadienyls, metal carbonyls, and combinations.

Nanoparticle Deposition & Patterning

In one embodiment, nanoparticle deposition is provided by Electrophoretic deposition (EPD). EPD is low-cost, uses readily available materials, and is highly reproducible. Typical apparatuses for EPD include a working and a counter electrode. EPD can use colloidal solutions, composed of a solvent and suspended nanoparticle. The mechanism of EPD can be influenced by driving voltage, working temperature, and deposition time. EPD provides nanoparticles that can be deposited into continuous thin films. EPD is an appropriate process for fabricating the substrates, including flexible substrates, as disclosed herein. EPD processes are typically performed at a low working temperature and provide a controllable deposition region. Various nanostructures can be prepared via using EPD.

In one aspect the arrangement comprises arrays or patterns of nanoparticles. The arranged nanoparticles can, where applicable, be a collection of substantially oriented nanoparticles arranged in a pattern, or alternatively, be a collection of substantially non-oriented nanoparticles arranged in a pattern. Oriented nanoparticles include without limitation nanorods and nanotubes, and other geometrical shapes. In one aspect, aqueous-phase routes are used to produce the nanoparticle seed materials. In another aspect, a multistage, seeded-growth method is used to present nanoparticles to a surface either randomly or in a pattern, where the nanoparticles can be non-oriented or oriented nanowires, nanotubes, and nanoneedles, as well as be presented as laminated films, columns, and multilayer heterostructures. For example, in aqueous-phase synthesis, oriented nanocrystalline films can be deposited on a thin-film, flexible, substrate in aqueous media by heterogeneous nucleation and subsequent growth thereof, by over homogeneous precipitation in solution and control of precursor supersaturation levels and interfacial energy between the substrate and the nanoparticles to be formed. This process includes direct deposition, or deposition on chemically modified interfaces using organic self-assembled monolayers (SAMs). Using such processes, either continuous films structures or arrays of nanoparticles (e.g., in the shape of nanorods or nanotubes) can be provided on the thin film flexible substrate. Additional components can be used and/or added to promote and/or control the arrangement and/or deposition of the nanoparticles on the substrate such as for example organic growth modifiers, surfactants, phospholipids, liposomes, and/or micelles. In other embodiments, a deposition technique is used to provide the nanoparticle seed material.

Deposition Techniques

In addition to a deposition technique to provide the nanoparticle seeding, in various aspects of the presently disclosed method, an amorphous inorganic phase can be deposited on or around the substrate comprising nanoparticles using one or more deposition process. In one aspect the deposition process is chosen so as to minimize undesirable thermal effects to the substrate, for example, a flexible polymer substrate or other thermally sensitive substrate. In various aspects of the embodiments herein disclosed, a deposition technology is utilized to deposit inorganic material on a conjugated polymer.

Exemplary examples of deposition processes for the inorganic materials that may be utilized in carrying out the methods herein disclosed include: low-temperature chemical vapor deposition (CVD); atomic layer deposition (ALD); corona discharge; dielectric barrier discharge; atmospheric pressure plasma jet; plasma enhanced chemical vapor deposition; atmospheric plasma glow discharge; atmospheric-pressure plasma liquid deposition; and magnetron sputtering. In one aspect, one or more of an evaporative deposition, a plasma or plasma-assisted deposition, chemical vapor deposition (CVD), metal organic chemical deposition (MOCVD), sputtering deposition, e.g., magnetron, is utilized to introduce, e.g., by depositing on or in, or depositing directly on or in, conformal inorganic material into porous regions of an organic material.

In one aspect, a networked organic phase, which can be polymeric, conductive polymeric, conjugated polymeric, and/or doped polymer is used as the substrate, the networked organic phase comprising suitably sized porous domains produced via solution or solvent-based methods, in combination with one or more nanoparticle seed deposition methods described above that introduces the nanoparticle seeds within the porous domains of the networked organic phase. Subsequently, deposition of an amorphous inorganic material forms pore-filling inorganic phases in combination with the nanoparticle seeds. The inorganic phase can be at least partially positioned within the organic phase. Using the methods described herein, the amorphous inorganic phase in combination with the nanoparticles can undergo induced crystallization to provide thin films and/or flexible thin-film substrates suitable for application in electronics and other energy harvesting devices.

Inducing Crystallization

In one embodiment, nanoparticles seeds are introduced to a substrate with a desired material. Nanoparticle seeds can be grown on the substrate as described above using aqueous solution and/or SAM techniques so as to control the size, population density, and spatial distribution (pattern) of the nanoparticles. In this embodiment, the nanoparticles presented to the surface of the substrate are substantially crystalline or completely crystalline. Several materials, such as ZnO, $TiO_2$, CdS, and those listed above, as well as other inorganics and/or semiconducting materials can be used. Such nanoparticles are available commercially or can be readily prepared using techniques reported in the literature. In one aspect, the nanoparticles seeds are deposited on the substrate using dip-coating, spin-coating, blade coating, sol-gel coating, and/or electrophoretic deposition techniques. In other aspects of the method, the nanoparticles are produced in a separate process and then physically deposited on the substrate. In yet another aspect of the present method, atomic layer deposition, radiofrequency (RF) magnetron sputtering, solution coating, atmospheric plasma deposition, and/or electrochemical deposition can be used to produce a nanoparticle seed layer prior to amorphous inorganic material coating. Once the nanoparticles seed layer is presented to the substrate and amorphous inorganic material is deposited thereon, crystal growth is induced in a second step, for example, by lateral epitaxial (homo- and hetro-epitaxial) crystallization, which, in one aspect, can be induced by the previous nanoparticle seeding, and/or mild heating, cooling, etc. Additional (prior, concurrent, post) processes can be used to facilitate various aspects of the method including, without limitation, substrate surface preparation for heterogeneous nucleation, heating below the decomposition temperature or other thermal transition point related to the substrate, cryogenic exposure, etc. The present method is generally applicable to preparing mixed material systems of one or more metals, metal oxides, conductive-nonconductive combinations of materials. The method herein disclosed is capable of providing high-quality crystalline, high surface/volume ratio thin films suitable for use for electronic photon transport applications including but not limited to photovoltaics, lasers, LEDs, solid state emitters, and other energy harvesting devices.

Exemplary embodiments of the present disclosure will now will be described with reference to the accompanying drawing, in which an embodiment of the present disclosure is shown, which are embodied in many different forms and should not be construed as limited to the embodiments set forth herein. Rather, this embodiment is provided so that this disclosure will be thorough and complete, and will fully convey the scope of the claims to those skilled in the art. Like numbers refer to like elements throughout.

With reference to the FIGURE, dispensing means 18 is use to introduce solution 20 comprising nanoparticles 22, to surface 11 of substrate 10. In one exemplary embodiment, step 100, as indicated by arrow, the nanoparticles solution solvent is evaporated leaving behind nanoparticles 22 on surface 13, which, as shown in expanded view 3, may be patterned with a an arrangement of nanoparticles 22, shown as physically separated on surface 13. The arrangement of nanoparticles can be patterned using physical or chemical masking techniques or computer controlled dispensing methods Nanoparticles 22 have average diameters of approximately 5 to about 100 nm. Step 200 depicts deposition process using for example atmospheric plasma deposition device 30, which provides inorganic material containing plasma 32 which is introduced to surface 13 forming new surface 15 of substrate 14. As shown in expanded view 5, nanoparticles 22 are at least partially covered by amorphous inorganic material 34a. Step 300 provides at least partial low temperature crystallization of amorphous inorganic material 34a, which is shown in expanded view 7 to provide an amount of crystalline inorganic material 34b on surface 17 of substrate 16, the amount of crystalline inorganic material 34b in one aspect being nucleated by nanoparticles 22. X-ray diffraction data can be used to determine and monitor the degree of crystallinity of amorphous material 34a, e.g., from lateral epitaxial crystallization from the subsequently deposited nanoparticles 22.

In various aspects of the embodiments herein disclosed, the present method provides a combination solution-deposition technology to deposit amorphous inorganic material on a conjugated polymer to provide a thin-film substrate. Such thin-film substrates are useful in the manufacture of organic-inorganic (hybrid) energy harvesting device. Exemplary examples of deposition processes for providing the amorphous inorganic materials that may be utilized in carrying out the methods herein disclosed include; low-temperature chemical vapor deposition (CVD); atomic layer deposition (ALD); corona discharge; dielectric barrier discharge; atmospheric pressure plasma jet; plasma enhanced chemical vapor deposition; atmospheric plasma glow discharge; atmospheric-pressure plasma liquid deposition; and magnetron sputtering. In one aspect, one or more of an evaporative deposition, a plasma or plasma-assisted deposition, chemical vapor deposition (CVD), metal organic chemical deposition (MOCVD), sputtering deposition, e.g., magnetron, is utilized to introduce, e.g., by depositing on or in, or depositing directly on or in, conformal inorganic material to porous regions of an organic material.
Batch/Semi-Batch/Continuous Processing The instantly described process may be configured and design to operate as a batch process, for example, nanoparticles solutions and their deposition to the substrate surface can be automated, and/or computer control. Nanoparticles solutions can be prepared, synthesized, commercially obtained, followed by a subsequent deposition onto a suitable substrate such as a polymeric film, conjugated polymer film, conductive substrate, or combinations thereof. The deposited nanoparticles can be patterned and/or oriented as described above in a separate process or in a continuous process, which can be in line with the deposition technique, in particular an atmospheric plasma deposition process. Alternatively, the instantly described process may be continuous, or semi-continuous including one or more of the steps described above.

From the foregoing description, various modifications and changes in the compositions and method will occur to those skilled in the art without varying from the scope of the invention as defined in the following claims.

What is claimed:
1. An organic material device comprising:
a substrate comprising an electrically conductive film of metal, indium tin oxide or a transparent conductive film;
an organic porous interpenetrating network comprising sized porous domains, the organic porous interpenetrating network positioned on the substrate;
a plurality of discrete nanoparticles disposed within the sized porous domains, the plurality of discrete nanoparticles comprising a material chosen from inorganic oxides, inorganic carbides, inorganic sulfides and inorganic nitrides, the plurality of discrete nanoparticles being crystalline nanoparticles and having an average dimension between 0.1 nm and 100 nm, the average dimension being a diameter or longest longitudinal axis of the nanoparticles; and
an inorganic thin film having been simultaneously deposited on both the organic porous interpenetrating network and the plurality of discrete nanoparticles, the inorganic thin film being at least partially crystalline and in direct physical contact with the plurality of discrete nanoparticles, the inorganic thin film comprising a material chosen from $Fe_2O_3$; oxides of boron, titanium, zinc, tungsten, vanadium, aluminum, niobium, silver and tin; nitrides of boron, titanium, zinc, iron, tungsten, vanadium, aluminum and niobium; carbides of boron, titanium, zinc, iron, tungsten, vanadium, aluminum and niobium; and mixtures and/or polymorphs thereof, wherein the inorganic thin film is a continuous film on the plurality of discrete nanoparticles, the plurality of discrete nanoparticles being detectable within the continuous film.

2. The organic material device of claim 1, wherein the crystalline nanoparticles are arranged in a pattern.

3. The organic material device of claim 1, wherein the inorganic thin film comprises a quantity of crystalline material that is the same as, and in addition to, the material of the crystalline nanoparticles.

4. The organic material device of claim 3, wherein the organic porous interpenetrating network comprises conjugated polymer fibers of a "pi-pi" stacked fiber structure, wherein the conjugated polymer fibers comprise branched, linear, or branched and linear covalently or non-covalently coupled fibers.

5. The organic material device of claim 1, wherein the substrate comprises a conjugated polymeric film.

6. The organic material device of claim 1, wherein the crystalline nanoparticles are semiconductive.

7. A device comprising:
a substrate;
an organic porous interpenetrating network comprising sized porous domains, the organic porous interpenetrating network positioned on the substrate;
a plurality of discrete inorganic nanoparticles disposed on the organic porous interpenetrating network, the plurality of discrete inorganic nanoparticles being crystalline nanoparticles and having an average dimension between 0.1 nm and 100 nm, the average dimension being a diameter or longest longitudinal axis of the nanoparticles; and
an inorganic thin film having been simultaneously deposited on both the organic porous interpenetrating network and the plurality of discrete inorganic nanoparticles, the inorganic thin film being in direct physical contact with the plurality of discrete inorganic nanoparticles and comprising a material chosen from $Fe_2O_3$; oxides of boron, titanium, zinc, tungsten, vanadium, aluminum, niobium, silver and tin; nitrides of boron, titanium, zinc, iron, tungsten, vanadium, aluminum and niobium; carbides of boron, titanium, zinc, iron, tungsten, vanadium, aluminum and niobium; and mixtures and/or polymorphs thereof, wherein the inorganic thin film is a continuous film on the plurality of discrete inorganic nanoparticles, the plurality of discrete inorganic nanoparticles being detectable within the continuous film.

8. The device of claim 7, wherein the crystalline nanoparticles are arranged in a pattern.

9. The device of claim 7, wherein the inorganic thin film comprises a quantity of crystalline material that is the same as, and in addition to, the material of the crystalline nanoparticles.

10. The device of claim 7, wherein the inorganic thin film comprises a quantity of crystalline material different than that of the crystalline nanoparticles.

11. The device of claim 7, wherein the organic porous interpenetrating network comprises conjugated polymer fibers of a "pi-pi" stacked fiber structure, wherein the conjugated polymer fibers comprise branched, linear, or branched and linear covalently or non-covalently coupled fibers.

12. The device of claim 7, wherein the substrate comprises a conjugated polymeric film.

13. The device of claim 7, wherein the inorganic thin film is at least partially crystalline.

14. The organic material device of claim 1, wherein the inorganic thin film comprises a quantity of crystalline material different than that of the crystalline nanoparticles.

15. A device comprising:
a substrate;
an organic porous interpenetrating network comprising sized porous domains, the organic porous interpenetrating network positioned on the substrate;
a plurality of discrete inorganic nanoparticles disposed on the organic porous interpenetrating network, the plurality of discrete inorganic nanoparticles being crystalline nanoparticles and having an average dimension between 0.1 nm and 100 nm, the average dimension being a diameter or longest longitudinal axis of the nanoparticles; and
a conformal, inorganic thin film having been simultaneously deposited on both the organic porous interpenetrating network and the plurality of discrete inorganic nanoparticles, the inorganic thin film being in direct physical contact with the plurality of discrete inorganic nanoparticles and comprising a material chosen from $Fe_2O_3$; oxides of boron, titanium, zinc, tungsten, vanadium, aluminum, niobium, silver and tin; nitrides of boron, titanium, zinc, iron, tungsten, vanadium, aluminum and niobium; carbides of boron, titanium, zinc, iron, tungsten, vanadium, aluminum and niobium; and mixtures and/or polymorphs thereof, wherein the inorganic thin film is a continuous film on the plurality of discrete inorganic nanoparticles, the plurality of discrete inorganic nanoparticles being detectable within the continuous film.

16. The device of claim 15, wherein the crystalline nanoparticles are arranged in a pattern.

17. The device of claim 15, wherein the inorganic thin film comprises a quantity of crystalline material that is the same as, and in addition to, the material of the crystalline nanoparticles.

18. The device of claim 15, wherein the inorganic thin film comprises a quantity of crystalline material different than that of the crystalline nanoparticles.

19. The device of claim 15, wherein the organic porous interpenetrating network comprises conjugated polymer fibers of a "pi-pi" stacked fiber structure, wherein the conjugated polymer fibers comprise branched, linear, or branched and linear covalently or non-covalently coupled fibers.

20. The device of claim 15, wherein the substrate comprises a conjugated polymeric film.

21. The device of claim 15, wherein the inorganic thin film is at least partially crystalline.

22. The device of claim 15, wherein the inorganic thin film is amorphous.

23. The device of claim 15, wherein the crystalline nanoparticles comprise c-ZnO and the inorganic thin film comprises a material chosen from a-ZnO and a-$TiO_2$.

* * * * *